United States Patent
Oka et al.

(10) Patent No.: US 7,889,027 B2
(45) Date of Patent: Feb. 15, 2011

(54) FILM BULK ACOUSTIC RESONATOR SHAPED AS AN ELLIPSE WITH A PART CUT OFF

(75) Inventors: Shuichi Oka, Kanagawa (JP); Terukazu Ohno, Kanagawa (JP)

(73) Assignee: Sony Corporation, Tokyo (JP)

( * ) Notice: Subject to any disclaimer, the term of this patent is extended or adjusted under 35 U.S.C. 154(b) by 395 days.

(21) Appl. No.: 12/066,317

(22) PCT Filed: Jul. 5, 2006

(86) PCT No.: PCT/JP2006/313403

§ 371 (c)(1),
(2), (4) Date: Mar. 10, 2008

(87) PCT Pub. No.: WO2007/029409

PCT Pub. Date: Mar. 15, 2007

(65) Prior Publication Data

US 2010/0156565 A1    Jun. 24, 2010

(30) Foreign Application Priority Data

Sep. 9, 2005   (JP) ............................ P2005-261573

(51) Int. Cl.
*H03H 9/13*   (2006.01)
*H03H 9/17*   (2006.01)
*H03H 9/54*   (2006.01)

(52) U.S. Cl. ..................... 333/187; 310/365; 310/367

(58) Field of Classification Search ......... 333/187–189; 310/365, 367

See application file for complete search history.

(56) References Cited

U.S. PATENT DOCUMENTS

| | | | | |
|---|---|---|---|---|
| 3,319,193 A | * | 5/1967 | Barnett ..................... | 333/187 |
| 3,421,109 A | * | 1/1969 | Wiggins et al. ......... | 331/116 R |
| 4,320,365 A | * | 3/1982 | Black et al. .............. | 333/187 |
| 5,369,382 A | * | 11/1994 | Arvanitis ................. | 333/189 |
| 5,903,087 A | * | 5/1999 | Mattson et al. .......... | 310/365 |
| 6,215,375 B1 | | 4/2001 | Larson, III et al. | |

(Continued)

FOREIGN PATENT DOCUMENTS

JP    2000-332568    11/2000

(Continued)

OTHER PUBLICATIONS

Japanese Office Action for corresponding JP2005-261573 issued on Oct. 19, 2010.

*Primary Examiner*—Barbara Summons
(74) *Attorney, Agent, or Firm*—K&L Gates LLP

(57) ABSTRACT

An object is to provide a film bulk acoustic resonator capable of improving resonant characteristics by reducing the generation of a standing wave to be caused by a transverse-mode acoustic wave to a minimum. In a film bulk acoustic resonator including a resonant portion A having a piezoelectric material layer 3 sandwiched between a first electrode 2 and a second electrode 4, the resonant portion A is configured to have a planar shape that is an ellipse having a part thereof cut off along a straight line L. The straight line L intersects at least one of a minor axis and a major axis of the ellipse, and preferably intersects both the minor axis and the major axis, and passes through the center of the ellipse.

10 Claims, 8 Drawing Sheets

U.S. PATENT DOCUMENTS

| | | | |
|---|---|---|---|
| 6,420,202 B1 * | 7/2002 | Barber et al. | 438/52 |
| 7,116,040 B2 * | 10/2006 | Inoue | 310/366 |
| 7,236,066 B2 * | 6/2007 | Ebuchi | 333/187 |
| 7,432,631 B2 * | 10/2008 | Taniguchi et al. | 310/320 |
| 2002/0030424 A1 * | 3/2002 | Iwata | 310/363 |
| 2004/0036383 A1 * | 2/2004 | Rubach | 310/365 |
| 2005/0099094 A1 * | 5/2005 | Nishihara et al. | 310/324 |

FOREIGN PATENT DOCUMENTS

| | | | |
|---|---|---|---|
| JP | 2003-273693 | | 9/2003 |
| JP | 2005-124107 | | 5/2005 |
| JP | 2005-184303 | | 7/2005 |
| JP | 2006-180290 | * | 7/2006 |

* cited by examiner (a)

(b)

(c)

(1)

(2)

(1)

(2)

(1)

(2)

(a)

(b)

(c)

(a)

(b)

(c)

FILM BULK ACOUSTIC RESONATOR SHAPED AS AN ELLIPSE WITH A PART CUT OFF

CROSS REFERENCE TO RELATED APPLICATIONS

The present application claims priority to Japanese Patent Document No. 2005-261573 filed on Sep. 9, 2005, the disclosure of which is herein incorporated by reference.

BACKGROUND

The present invention relates to a film bulk acoustic resonator that can be suitably used for a small-sized high-frequency filter to be used in a communication device.

In recent years, due to improvements in functions and speeding up of communication devices, such as cellular phones and PDA (personal digital assistant: personal portable information communication) devices, further miniaturization and reduction in cost have been required for internal high-frequency filters operating at a frequency from several hundred MHz to several GHz. As promising candidates that meet such requirements, band-pass filters in which film bulk acoustic resonators (Film Bulk Acoustic Resonators: FBARs) are arranged in a ladder form and through which only electric signals in a desired frequency band pass with low loss are available. This is because, since film bulk acoustic resonators are formed by application of a semiconductor manufacturing technology, reductions in size and cost can be easily achieved.

FIG. 7 shows, as an example of a typical configuration of a film bulk acoustic resonator, a configuration of a film bulk acoustic resonator of an air-bridge type. Here, part (a) of FIG. 7 is a plan view, and parts (b) and (c) of FIG. 7 are sectional views taken along line V-V' and line I-I', respectively, of part (a) of FIG. 7. In the film bulk acoustic resonator shown in the drawings, a resonant portion A formed by stacking a first electrode 2, a piezoelectric material layer 3, and a second electrode 4 is provided on a substrate 1 with an air space a therebetween.

The film bulk acoustic resonator having such a configuration utilizes a resonant wave obtained by causing a longitudinal-mode acoustic wave, which propagates in a direction that is perpendicular to electrode surfaces of the first electrode 2 and the second electrode 4, to be reflected and resonated at a boundary surface of the piezoelectric material layer 3. However, within the piezoelectric material layer 3, a transverse-mode acoustic wave, which propagates in a direction that is parallel to the electrode surfaces, is also induced. In a case where such a transverse-mode acoustic wave is repeatedly reflected at a region in which the first electrode 2 and the second electrode 4 overlap each other, that is, an end of the resonant portion A operating as a film bulk acoustic resonator, and a standing wave is thus generated, electrical characteristics of the film bulk acoustic resonator and a band-pass filter using the film bulk acoustic resonator are significantly deteriorated.

SUMMARY

More specifically, since transverse-mode acoustic waves propagate a long distance compared with longitudinal-mode acoustic waves, the frequency of a transverse-mode acoustic wave is significantly lower than the frequency of a longitudinal-mode acoustic wave (that is, a resonance frequency $\gamma$), and a higher harmonic wave component of a transverse-mode acoustic wave may have a frequency in the vicinity of the resonance frequency $\gamma$. Thus, noise called spurious occurs in the resonant characteristics of such a film bulk acoustic resonator. If the above-described band-pass filter is formed using such a film bulk acoustic resonator, a ripple occurs in a pass frequency band, thus causing an unnecessarily large insertion loss.

As a method for suppressing the generation of standing waves to be caused by transverse-mode acoustic waves in a film bulk acoustic resonator, some configurations defining the planar shape of a resonant portion A have been suggested. For example, in Japanese Unexamined Patent Application Publication No. 2000-332568 (in particular, see paragraph 21), as shown in FIG. 8, a configuration in which the planar shape of a resonant portion A is an irregular polygon not having parallel sides is disclosed. With this configuration, as shown by a path represented by an arrow in the drawing, a transverse-mode acoustic wave originating from point 8, which is on a single wall, does not return to the same point 8, from which the acoustic wave originated, by reflection at an opposing wall. Thus, generation of a standing wave is avoided. In addition, in Japanese Unexamined Patent Application Publication No. 2005-124197 (in particular, see paragraphs 11 and 13), as shown in FIG. 9, since the planar shape of a resonant portion is a particular ellipse, problems of generation of unwanted spurious in the impedance characteristics of a resonator due to a transverse-mode wave and occurrence of a ripple in the pass band of a filter can be suppressed.

However, as described in Japanese Unexamined Patent Application Publication No. 2000-332568 (in particular, see paragraph 21), although the configuration in which the planar shape of the resonant portion is an irregular polygon not having parallel sides is effective for reducing the generation of a standing wave to be caused by a transverse-mode acoustic wave in a small-sized film bulk acoustic resonator, it is unknown how many degrees should be set as each of vertex angles corresponding to sides of the irregular polygon. Furthermore, the larger the number of sides forming the polygon, the larger the number of vertex angles to be set. Thus, it is difficult to obtain the optimal solution of the planar shape. That is, in a case where a band-pass filter is formed using such a film bulk acoustic resonator, a predetermined capacitance is set for the film bulk acoustic resonator. The capacitance is determined in accordance with the area of the resonant portion. It is necessary to obtain the optimal solution of the planar shape such that the resonant portion has a predetermined area, and the involved operation is complicated.

In addition, as described in Japanese Unexamined Patent Application Publication No. 2005-124197 (in particular, see paragraphs 11 and 13), with the configuration in which the planar shape of the resonant portion is an ellipse, as represented by arrows in FIG. 9, transverse-mode acoustic waves originating from a peripheral end 8 that intersects a major axis of the ellipse and from a peripheral end 8' that intersects a minor axis of the ellipse toward the center O of the ellipse return to the peripheral ends 8 and 8', respectively, by a corresponding single reflection. Moreover, on a path running along a particular rectangular shape inscribed within the ellipse, a transverse-mode acoustic wave originating from a single inscribed point 8" returns to the inscribed point 8", from which the transverse-mode acoustic wave originated, by three reflections. That is, with the configuration in which the planar shape of the resonant portion is an ellipse, three generation paths for generating standing waves by transverse-mode acoustic waves exist. This does not achieve a sufficient effect of reducing the generation of standing waves.

Accordingly, an object of the present invention is to provide a film bulk acoustic resonator that is capable of improving resonant characteristics by suppressing the generation of a standing wave to be caused by a transverse-mode acoustic wave to a minimum.

In order to achieve the above-described object, the present invention relates to a film bulk acoustic resonator including a resonant portion having a piezoelectric material layer sandwiched between a first electrode and a second electrode, and, in particular, is characterized in that the resonant portion is configured to have a planar shape that is an ellipse having a part thereof cut off.

Since the planar shape of the resonant portion is configured as described above, a generation path for generating a standing wave to be caused by a transverse-mode acoustic wave induced within the resonant portion and reflected by an outer peripheral wall is reduced. For example, by intersecting a straight line along which a part of the ellipse is cut off with at least one of a minor axis and a major axis of the ellipse, at least one of generation paths for standing waves along the minor axis and the major axis can be reduced. Thus, generation of a standing wave to be caused by a transverse-mode acoustic wave can be suppressed. Furthermore, since the planar shape of the resonant portion is a shape that is a cut ellipse, calculation of the area of the resonant portion, that is, the capacitance of the resonator, can be easily performed.

As described above, according to the film bulk acoustic resonator of the present invention, with a simple configuration in which the planar shape of the resonant portion is a shape that is an ellipse having a part thereof cut off, generation of a standing wave to be caused by a transverse-mode acoustic wave can be suppressed. Thus, even with easy design, an improvement in resonant characteristics can be achieved. In addition, a reduction in the insertion loss in a band-pass filter using such a film bulk acoustic resonator can be achieved.

Additional features and advantages of the present invention are described in, and will be apparent from, the following Detailed Description and the Figures.

DETAILED DESCRIPTION

An embodiment in which the present invention is applied to a film bulk acoustic resonator of an air-bridge type will be described with reference to the drawings.

First Embodiment

Figure 1:
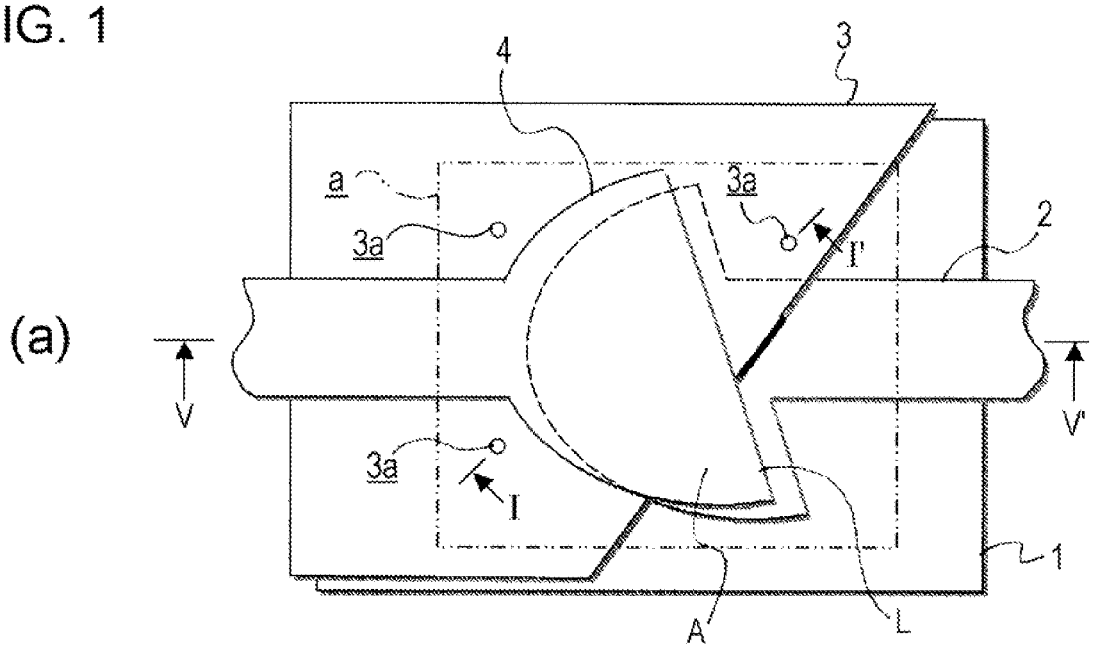
FIG. 1 includes illustrations showing the configuration of a film bulk acoustic resonator according to a first embodiment.
Figure 1:
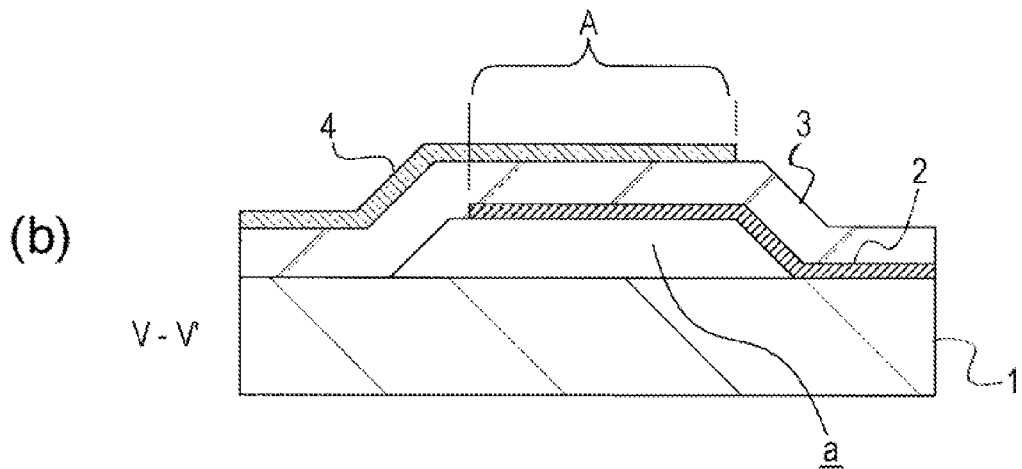
Figure 1:
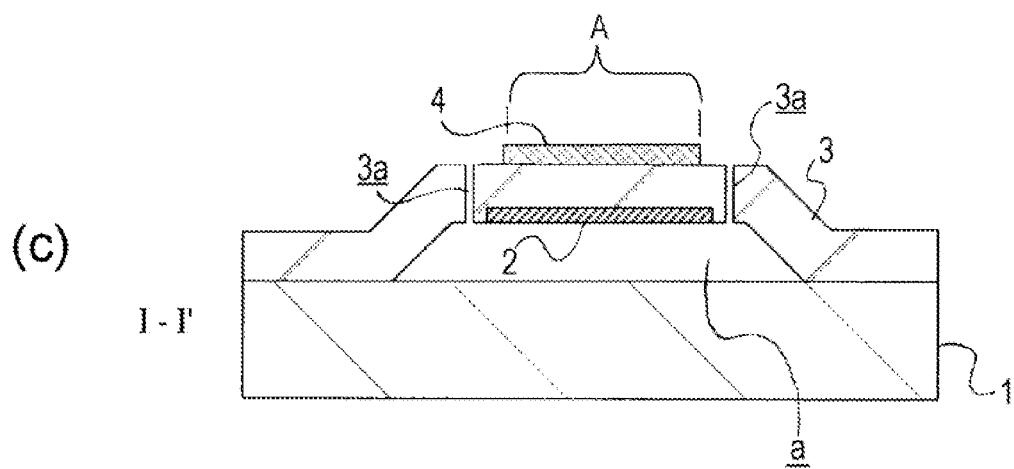
Figure 7:
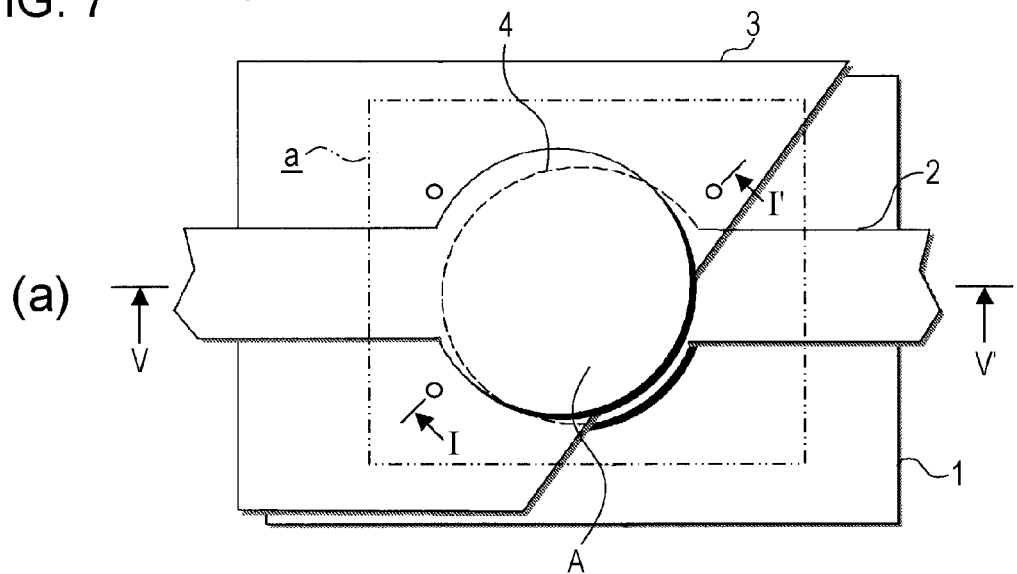
FIG. 7 includes illustrations showing the configuration of a known film bulk acoustic resonator.
Figure 7:
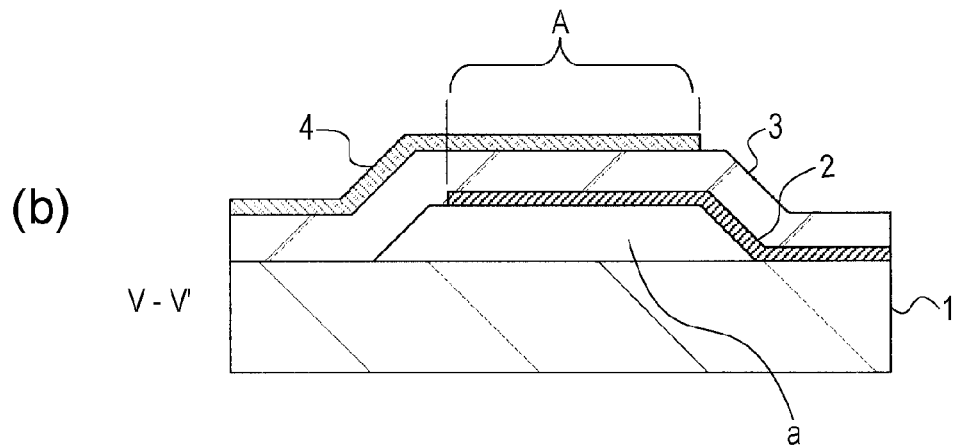
Figure 7:
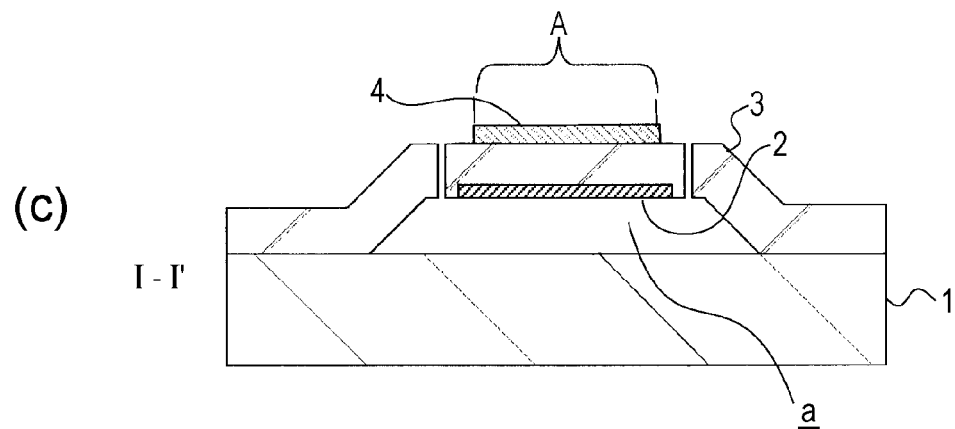
Figure 8:
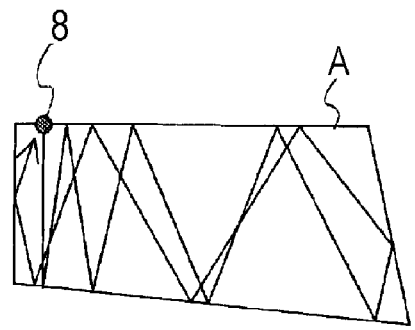
FIG. 8 is an illustration showing an example of the planar shape of a resonant portion of the known film bulk acoustic resonator.

Part (a) of FIG. 1 is a plan view of a film bulk acoustic resonator according to a first embodiment. For convenience of explanation, in part (a) of FIG. 1, the piezoelectric material layer 3 a part of which is cut off is illustrated. Part (b) of FIG. 1 is a V-V' sectional view of the plan view, and part (c) of FIG. 1 is an I-I' sectional view of the plan view. Here, in FIG. 1, parts corresponding to those in FIG. 7, which is used for the description of the background art, are represented by the same symbols.

The film bulk acoustic resonator shown in the drawings includes a resonant portion A formed by stacking a first electrode 2, a piezoelectric material layer 3, and a second electrode 4 in that order above a substrate 1 with an air space a therebetween. In addition, in this embodiment, the planar shape of the resonant portion A, that is, the shape viewed in a thickness direction in a case where the second electrode 4, the piezoelectric material layer 3, and the first electrode 2 are viewed from the direction of the thickness of the second electrode 4, the piezoelectric material layer 3, and the first electrode 2, is a shape that is a cut ellipse, as explained in detail later.

First, prior to a detailed explanation of the planar shape of the resonant portion A, the basic configuration and basic operation of a film bulk acoustic resonator will be described.

First, the first electrode 2, which is formed above the substrate 1, is patterned in a shape in which the first electrode 2 is disposed above the air space a with a part (in the drawing, a leading-end part) of the first electrode 2 being separated from the substrate 1, and the first electrode 2 is provided such that the bottom surface of the first electrode 2 is in contact with the air space a. In addition, the piezoelectric material layer 3, which is provided on the first electrode 2, is provided in a state in which the piezoelectric material layer 3 covers over the upper surface of the first electrode 2 and the substrate 1 and in which the piezoelectric material layer 3 straddles the air space a in a bridge shape or covers the entire air space a. In addition, the second electrode 4, which is provided on the piezoelectric material layer 3, is provided in a state in which a part (in the drawing, a leading-end part) of the second electrode 4 is stacked on the first electrode 2 and the piezoelectric material layer 3 above the air space a.

Here, it is assumed that the thickness of the air space a, which is located below the resonant portion A, is about 0.5 to about 3 μm. In addition, the resonant portion A, in which the first electrode 2 and the second electrode 4 overlap each other, keeps a space portion above thereof, so that the resonant portion A is in a state in which the resonant portion A is held on the substrate 1 such that the resonant portion A can oscillate freely.

In the above-described configuration, the substrate 1 is made of high-resistivity silicon or high-resistivity gallium arsenide. In addition, the first electrode 2 and the second electrode 4 are made of molybdenum, tungsten, titanium, platinum, aurum, ruthenium, aluminum, or the like, and is patterned with a film thickness of about 0.1 to about 0.5 μm. In addition, the piezoelectric material layer 3 is made of aluminum nitride or zinc oxide and is patterned with a film thickness of about 0.5 to about 2 μm.

In addition, the first electrode 2, the piezoelectric material layer 3, and the second electrode 4 are sequentially formed using a sputtering deposition technology, which is well-known as a semiconductor manufacturing technology, or any type of etching technology in which a resist is used as a mask. In addition, the air space a is formed by etching of a sacrifice layer pattern, for which illustration is omitted here. For example, a sacrifice layer pattern made of a silicon dioxide film, a PSG film (phosphorus silicate glass, which is silica glass to which phosphorus is added), a BPSG film (boron phosphorus silicate glass, which is silica glass to which boron and phosphorus are added), a SOG film, or the like is formed on the substrate 1. Then, the first electrode 2, the piezoelectric material layer 3, and the second electrode 4 are formed above the substrate 1, on which the sacrifice layer pattern is formed. After that, the sacrifice pattern is eliminated by etching using HF aqueous solution from opening portions 3a provided in the piezoelectric material layer 3, so that the air space a can be formed.

The film bulk acoustic resonator having the above configuration operates as described below.

When an alternating voltage is applied between the first electrode 2 and the second electrode 4 to generate an alternating electric field, the piezoelectric material layer 3 converts part of electrical energy into mechanical energy, which is in the form of an elastic wave.

This mechanical energy is propagated in the film-thickness direction of the piezoelectric material layer 3 (the vertical direction), which is a direction perpendicular to the electrode surfaces of the first electrode 2 and the second electrode 4, and is converted again into electrical energy. In the conversion process of electrical/mechanical energy, a particular frequency exhibiting an excellent efficiency exists. When an alternating voltage having the frequency is applied, the film bulk acoustic resonator exhibits a significantly low impedance.

The particular frequency is generally called a resonance frequency $\gamma$. As a primary approximation, in a case where the existence of the second electrode 4 and the first electrode 2 is neglected, when the speed of an acoustic wave in the piezoelectric material layer 3 is denoted by V and the thickness of the piezoelectric material layer 3 is denoted by t, the value $\gamma$ is represented by resonance frequency $\gamma=V/(2t)$.

In addition, when the wavelength of an acoustic wave is denoted by $\lambda$, since the relationship of acoustic wave speed $V=\gamma\lambda$ is established, piezoelectric material layer 3 thickness $t=\lambda/2$ is achieved.

This means that an acoustic wave induced within the piezoelectric material layer 3 is repeatedly reflected up and down at the boundary surface between the piezoelectric material layer 3 and the first electrode 2 and at the boundary surface between the piezoelectric material layer 3 and the second electrode 4 and a standing wave that exactly corresponds to the half-wavelength of the acoustic wave is generated.

In other words, the frequency of an acoustic wave at which a half-wavelength standing wave occurs and the frequency of an externally applied alternating voltage that are equal to each other corresponds to a resonance frequency $\gamma$.

Figure 2:
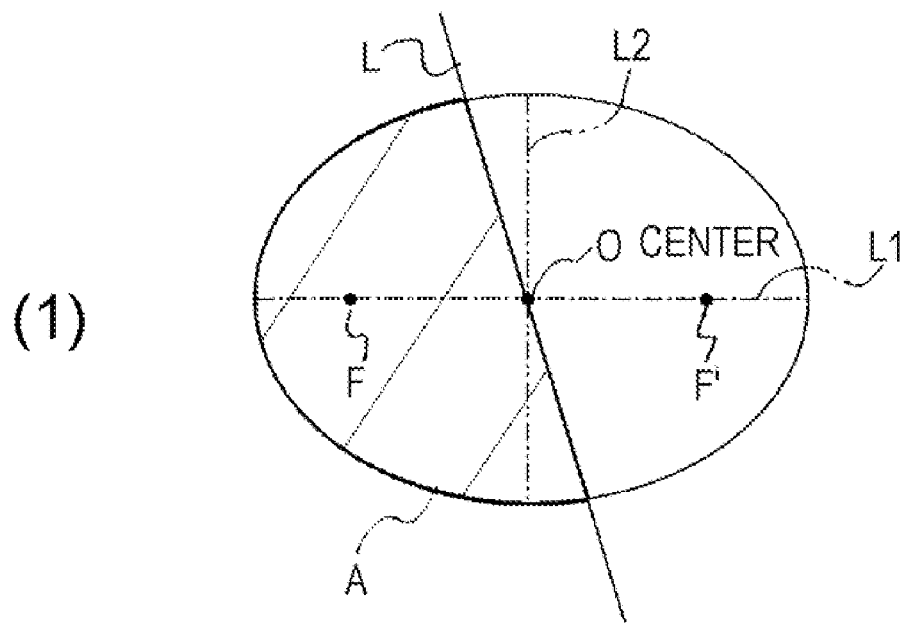
FIG. 2 includes illustrations each showing a specific example of the planar shape of the resonant portion of the film bulk acoustic resonator according to the first embodiment.
Figure 2:
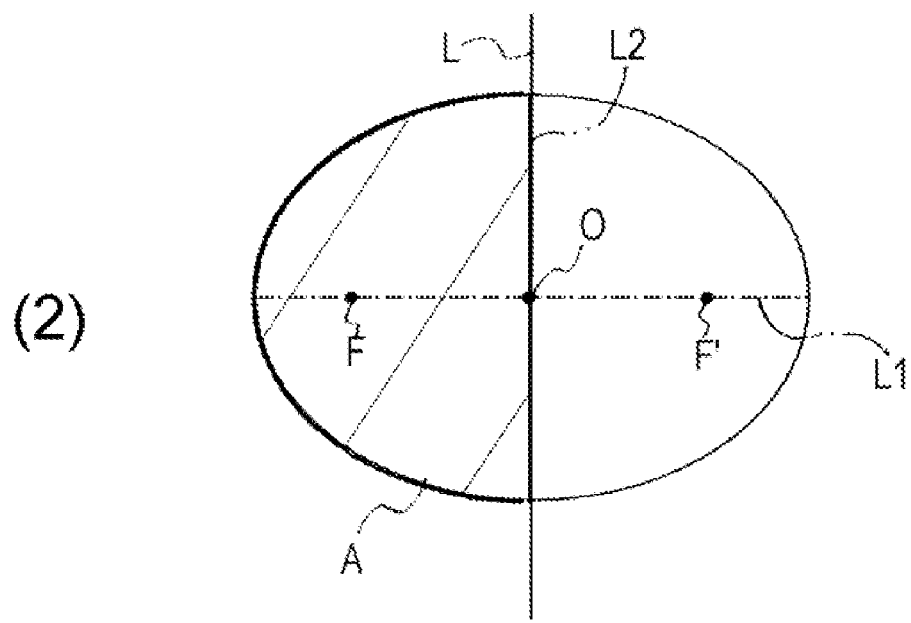
Figure 3:
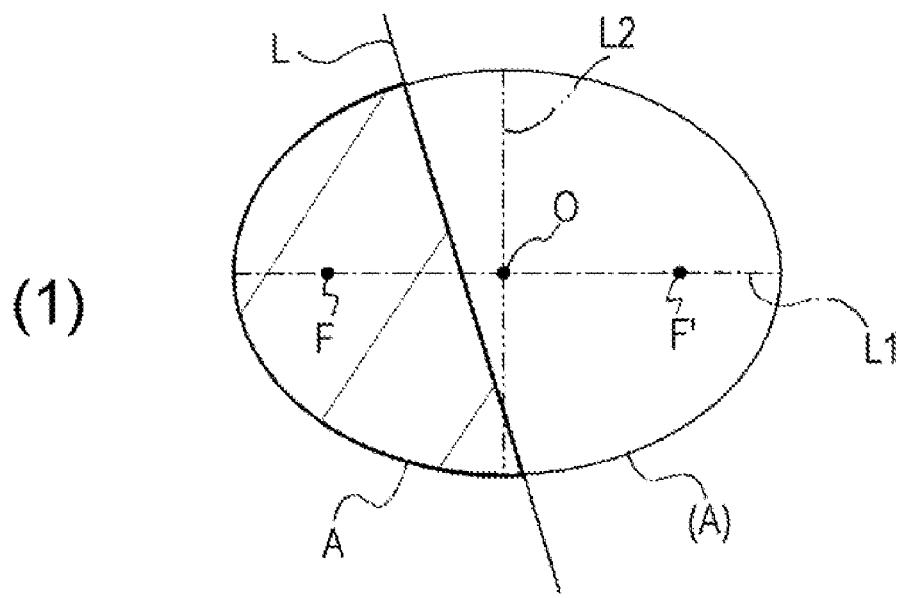
FIG. 3 includes illustrations each showing another specific example of the planar shape of the resonant portion of the film bulk acoustic resonator according to the first embodiment.
Figure 3:
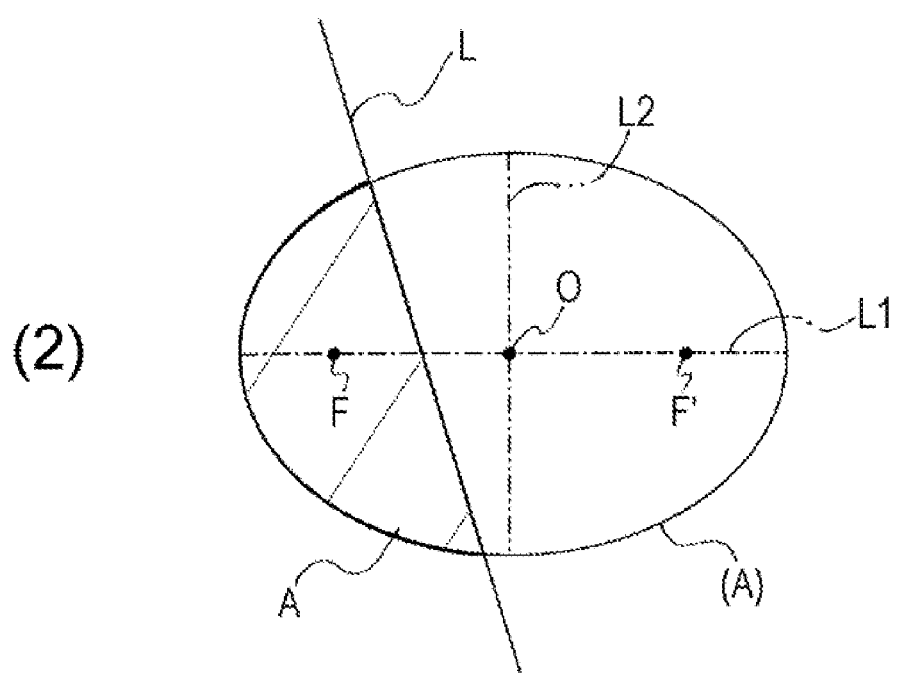

Next, in the film bulk acoustic resonator having the above configuration, the planar shape of a resonant portion A, which is a feature of the present invention, will be described. FIGS. 2 and 3 are plan views for explaining the planar shape of the resonant portion A.

As shown in part (1) of FIG. 2, it is assumed that the planar shape of the resonant portion A is configured to be a planar shape that is an ellipse having a part thereof cut off along a straight line L. As an example of the straight line L along which the ellipse is cut, the straight line L is provided so as to intersect a major axis L1 and a minor axis L2 at the center O, which is an median point of foci F and F' of the ellipse.

In addition, as shown in part (2) of FIG. 2, the straight line L along which the ellipse is cut may overlap the minor axis L2 passing through the center O of the ellipse. Furthermore, although illustration is omitted here, the straight line L along which the ellipse is cut may overlap the major axis L1 passing through the center O of the ellipse.

Furthermore, as shown in part (1) of FIG. 3, the straight line L along which the ellipse is cut may be provided so as to intersect both the major axis L1 and the minor axis L2 and not to pass through the center O of the ellipse. In this case, as illustrated, a planar shape not containing the center O may be adopted as that of the resonant portion A or a planar shape containing the center O may be adopted as that of a resonant portion (A).

In addition, as shown in part (2) of FIG. 3, the straight line L along which the ellipse is cut may be provided so as to intersect one of the major axis L1 and the major axis L1 and not to pass through the center O of the ellipse. Although a case where the major axis L1 and the straight line L intersect each other is shown in the drawing, the minor axis L2 and the straight line L may intersect each other. In this case, as illustrated, it is desirable that a planar shape not containing the center O is adopted as that of the resonant portion A. However, a planar shape containing the center O may be adopted as that of a resonant portion (A).

In the case of part (1) of FIG. 3 and the case of part (2) of FIG. 3, the straight line L along which the ellipse is cut may pass through the focus F (F') and may intersect a segment of the foci F-F'.

Figure 4:
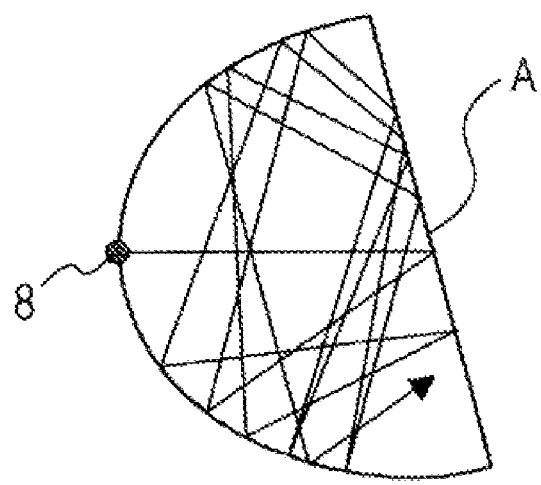
FIG. 4 is an illustration showing a path for a transverse-mode acoustic wave in the resonant portion of the film bulk acoustic resonator according to the first embodiment.
Figure 9:
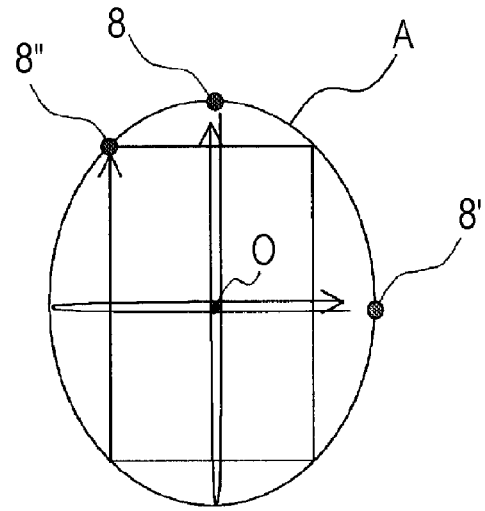
FIG. 9 is an illustration showing another example of the planar shape of the resonant portion of the known film bulk acoustic resonator.

For the resonant portion A having the above planar shape, as shown in FIG. 4, a transverse-mode acoustic wave originating from the peripheral end 8 is repeatedly reflected many times. Thus, substantially, a propagation path (a generation path for a standing wave) represented by an arrow in the drawing is very long. That is, as explained with reference to FIG. 9, in the resonant portion A whose planar shape is an ellipse, three paths serving as generation paths for standing waves exist. However, as in the above-described embodiment, in the resonant portion A having a planar shape that is an ellipse having a part thereof cut off, all the three generation paths are extinguished. Thus, generation of a standing wave to be caused by a transverse-mode acoustic wave can be suppressed.

In particular, as shown in part (1) of FIG. 2 and part (1) of FIG. 3, in a case where the straight line L along which the ellipse is cut intersects the major axis L1 and the minor axis L2, both the generation paths for standing waves along the major axis L1 and the minor axis L2 can be reliably extinguished. Thus, a large effect of suppressing the generation of a standing wave to be caused by a transverse-mode acoustic wave can be achieved. The same applies to a case where a planar shape that is an ellipse cut along a straight line L, which cuts the ellipse and intersects one of the major axis L1 and the minor axis L2, and that does not contain the center O is adopted as that of the resonant portion A, as shown in part (2) of FIG. 3.

Moreover, since the planar shape of the resonant portion A is a shape that is a cut ellipse, calculation of the area of the resonant portion A, that is, the capacitance of a resonator, can be easily performed. In particular, as shown in part (1) of FIG. 2 and part (2) of FIG. 2, in a case where the straight line L along which the ellipse is cut passes through the center O, the area of the resonant portion A is half the area of the ellipse. Thus, calculation of the capacitance of the resonator can be performed extremely easily.

As a result, according to the film bulk acoustic resonator of the above-described embodiment, capacitance design of the resonant portion A can be easily performed, and an improvement in the resonant characteristics can be achieved. In addition, a reduction in the insertion loss in a band-pass filter using such a film bulk acoustic resonator can be achieved.

Figure 5:
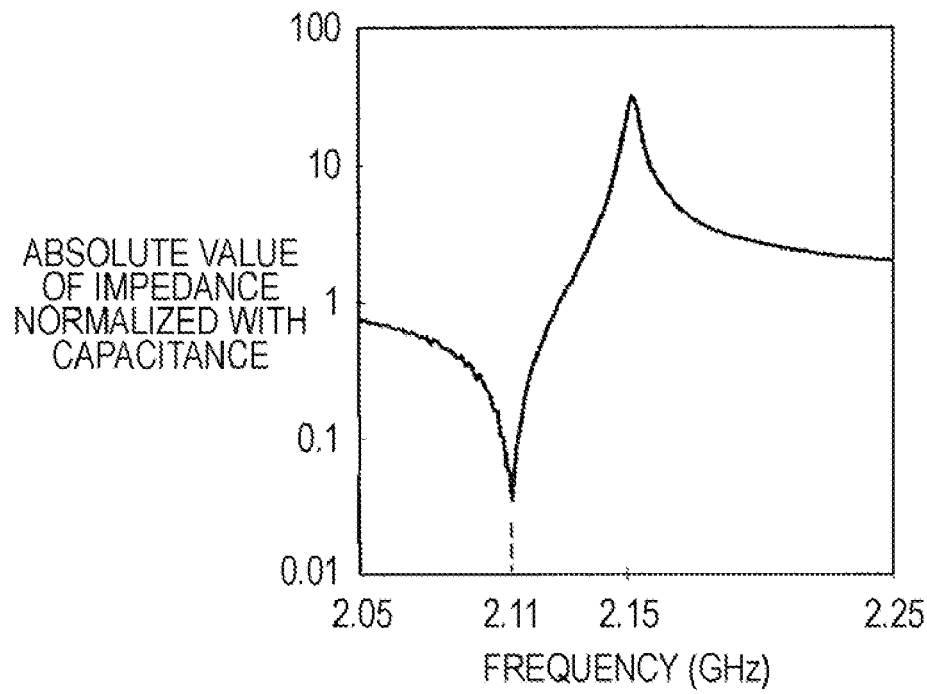
FIG. 5 includes part (1) showing the absolute value of an impedance measured for the film bulk acoustic resonator according to the first embodiment and part (2) showing the absolute value of an impedance measured for a comparative example.
Figure 5:
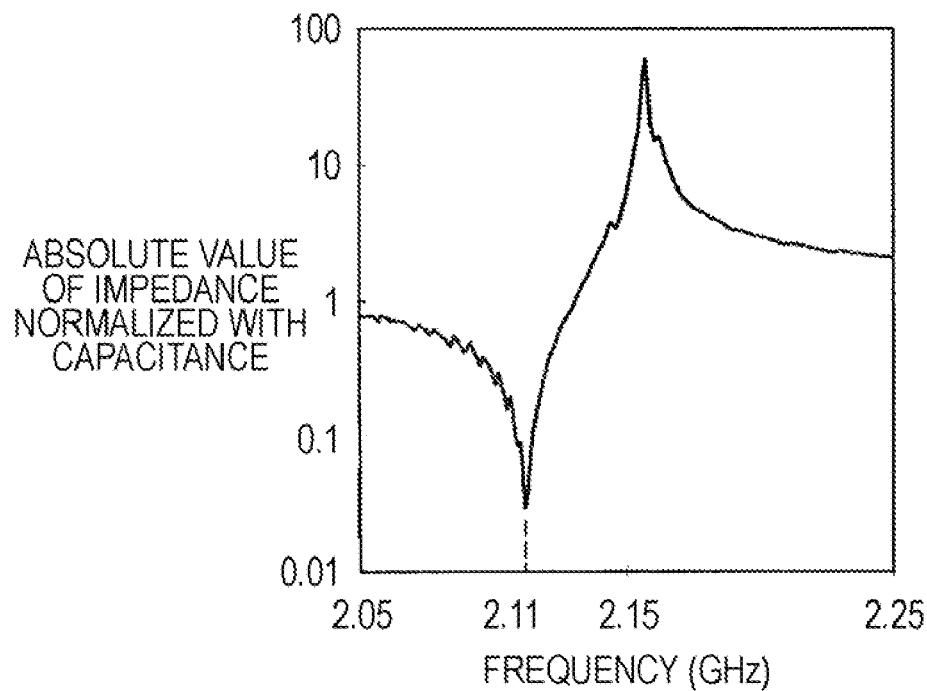

In part (1) of FIG. 5, a result of measurement of the absolute value of an impedance for a film bulk acoustic resonator that was experimentally fabricated as in this embodiment is shown. In this case, the example shown in part (1) of FIG. 2 is adopted as the planar shape of the resonant portion A. The major axis L1 of the ellipse is 144 µm, and the minor axis L2 is 124 µm. In addition, the planar shape is formed such that the ellipse is cut along the straight line L that passes through the center O of the ellipse and that intersects the major axis L1 at an angle of 85°.

In part (2) of FIG. 5, for comparison, a result of measurement of the absolute value of an impedance for a film bulk acoustic resonator including a resonant portion A whose planar shape is a circle (a radius of 47.3 µm) is shown.

In addition, the absolute value of an impedance is normalized with a capacitance in a case where a film bulk acoustic resonator is regarded as being merely a capacitance between parallel flat plates. As a basic structure constant, the thickness of molybdenum electrodes, which are used as the first electrode 2 and the second electrode 4, is set to 0.39 µm, and the thickness of an aluminum nitride layer, which is used as the piezoelectric material layer 3, is set to 0.7 µm (see FIG. 1).

First, a comparative example will be explained. As shown in part (2) of FIG. 5, in the film bulk acoustic resonator according to the comparative example including the resonant portion A whose planar shape is a circle, in a frequency range near and lower than a resonance frequency, which is about 2.11 GHz, the impedance varies in a noise-like manner. Thus, generation of a standing wave to be caused by a transverse-mode acoustic wave is observed. In addition, generation of a standing wave to be caused by a transverse-mode acoustic wave is also observed in the vicinity of an antiresonance frequency, which is about 2.15 GHz.

Compared with this, as shown in part (1) of FIG. 5, in the film bulk acoustic resonator according to the embodiment including the resonant portion A whose planar shape is a shape that is an ellipse having a part thereof cut off along the straight line L, a large noise-like change in the impedance is not observed even in the vicinity of the resonance frequency, which is about 2.11 GHz, and a relatively smooth change is observed. In addition, a noise-like change in the impedance is not observed in the vicinity of the antiresonance frequency, which is about 2.15 GHz. Thus, since the planar shape of the resonant portion A is a shape that is an ellipse having a part thereof cut off along the straight line L, it was confirmed that generation of a standing wave to be caused by a transverse-mode acoustic wave is suppressed.

In addition, in the first embodiment, a portion in which the first electrode 2, the piezoelectric material layer 3, and the second electrode 4 are stacked above the air space a can serve as the resonant portion A configured to have the above-described planar shape. Thus, the planar shape of the first electrode 2 and the planar shape of the second electrode 4 that are provided above the air space a are not necessarily the same. For example, the shape of the first electrode 2 above the air space a may be a rectangular shape and the shape of the second electrode 4, which is to be disposed above the first electrode 2, may be the above-described shape that is an ellipse having a part thereof cut off within the range of the rectangular shape. Alternatively, by configuring the first electrode 2 and the second electrode 4 to be in similar shapes and setting the size of one of the first electrode 2 and the second electrode 4 to be larger than the other of the first electrode 2 and the second electrode 4, a margin for positional displacement in pattern formation of these electrodes may be ensured.

Second Embodiment

Figure 6:
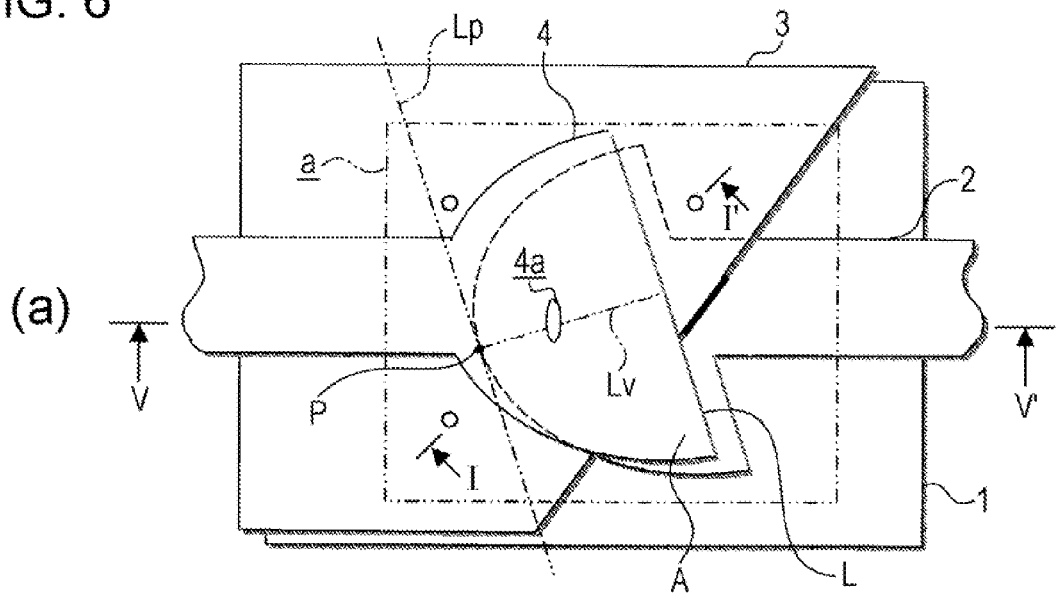
FIG. 6 includes illustrations showing the configuration of a film bulk acoustic resonator according to a second embodiment.
Figure 6:
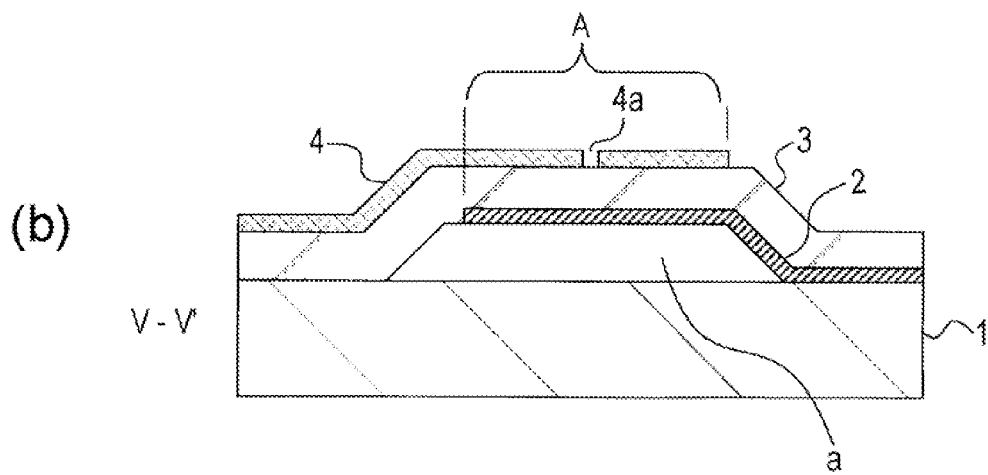
Figure 6:
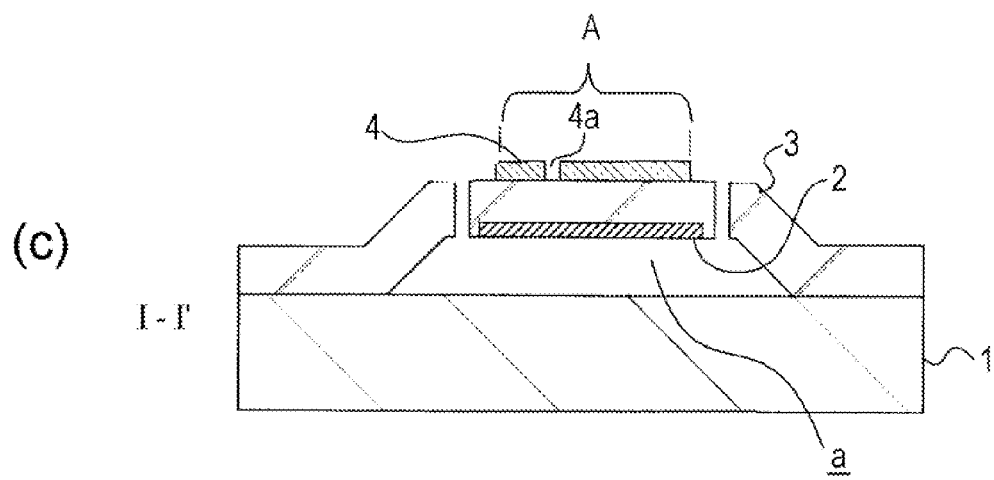

Part (a) of FIG. 6 is a plan view of a film bulk acoustic resonator according to a second embodiment, part (b) of FIG. 6 is a V-V' sectional view of the plan view, and part (c) of FIG. 6 is an I-I' sectional view of the plan view.

The film bulk acoustic resonator shown in the drawings is different from the film bulk acoustic resonators explained with reference to FIGS. 1 to 4 in that a hole part 4a that extends to the piezoelectric material layer 3 is provided in a portion of the second electrode 4 of the resonant portion A. The other features of the configuration of the film bulk acoustic resonator shown in the drawings are similar to those of the film bulk acoustic resonators explained with reference to FIGS. 1 to 4.

That is, as explained in the first embodiment, the resonant portion A of the film bulk acoustic resonator according to the second embodiment is configured to have a planar shape that is an ellipse having a part thereof cut off. In addition, in the resonant portion A having such a configuration, the hole part 4a extending to the piezoelectric material layer 3 is provided in a portion of the second electrode 4 forming the resonant portion A. In this case, it is important that the hole part 4a has a planar shape in which a transverse-mode acoustic wave is repeatedly reflected irregularly. As such a planar shape, for example, the hole part 4a has a planar shape that does not have a side parallel to the straight line L. In addition, in the resonant portion A, a portion in which the hole part 4a having such a planar shape is provided locally serves as a non-conductive region (non-resonant region).

Here, the position in which the hole part 4a is to be provided may be near the center of the resonant portion A. Thus, since the hole part 4a is provided in such a portion, increasing the temperature near the center of the resonant portion A to be higher than the ambient temperature, which is to be caused by heat generated at the operation of the film bulk acoustic resonator, and thus causing the resultant breakdown of the first electrode 2 or the second electrode 4 can be avoided.

In addition, in particular, as the position in which the hole part 4a is to be provided, in a case where a tangent line Lp that is parallel to the straight line L along which the ellipse is cut is assumed to be used, it is desirable that the hole part 4a is provided on a normal line Lv that is provided for the straight line L from a tangent point P on the tangent line Lp. That is, it is desirable that the hole part 4a is provided on, from among normal lines provided for the straight line L along which the ellipse is cut, a normal line Lv passing through the tangent point P on the tangent line Lp of the ellipse that is parallel to the straight line L.

Consequently, a generation path for a standing wave to be caused by a transverse-mode acoustic wave along the above-described normal line Lv is interrupted by the hole part 4a. Thus, the generation path can be extinguished. Therefore, an effect of suppressing a standing wave in the first embodiment can further be improved.

In addition, the hole part 4a formed in the second embodiment may be provided in the first electrode 2 or may be provided on each of the first electrode 2 and the second electrode 4. Even in a case where a hole part is provided in the first electrode 2, the planar formation position of the hole part can be a position similar to the above-described hole part 4a to be provided in the second electrode 4 and a similar advantage can be achieved.

In the above-described first embodiment and second embodiment, configurations in which the present invention is applied to an air-bridge-type film bulk acoustic resonator in which the resonant portion A is provided above the substrate 1 with the air space a therebetween have been explained. However, the present invention is also applicable to a film bulk acoustic resonator including a resonant portion having a piezoelectric material layer sandwiched between the first electrode and the second electrode, and a similar advantage can be achieved. Thus, by application of the present invention, even a membrane-type film bulk acoustic resonator or an acoustic-reflecting-mirror-type film bulk acoustic resonator can achieve a similar advantage (for a membrane-type film acoustic bulk resonator, see K. M. Lakin, "Thin Film Resonators and Filters," Proceedings of IEEE Ultrasonics Symposium, pp. 895-906, 1999.)

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A film bulk acoustic resonator comprising a single resonant portion having a piezoelectric material layer sandwiched between a first electrode and a second electrode, wherein:
the resonant portion is configured to have a planar shape that is an ellipse having a part thereof cut off along a straight line.

2. The film bulk acoustic resonator according to claim 1, wherein:
the straight line along which the ellipse is cut intersects at least one of a minor axis and a major axis of the ellipse.

3. The film bulk acoustic resonator according to claim 2, wherein:
the straight line along which the ellipse is cut intersects the minor axis and the major axis of the ellipse.

4. The film bulk acoustic resonator according to claim 2, wherein:
the straight line along which the ellipse is cut intersects one of the minor axis and the major axis of the ellipse; and
the planar shape that is the ellipse having the part thereof cut off along the straight line does not contain the center of the ellipse.

5. The film bulk acoustic resonator according to claim 1, wherein:
the straight line along which the ellipse is cut passes through the center of the ellipse.

6. The film bulk acoustic resonator according to claim 1, wherein:
in at least one of the first electrode and the second electrode within the planar shape forming the resonant portion, a hole part extending to the piezoelectric material layer is provided.

7. The film bulk acoustic resonator according to claim 6, wherein:
the hole part is provided on, from among normal lines to be provided for the straight line along which the ellipse is cut, a normal line passing through a tangent point on a tangent line of the ellipse, the tangent line being parallel to the straight line.

8. A film bulk acoustic resonator comprising:
a resonant portion having a piezoelectric material layer sandwiched between a first electrode and a second electrode,
wherein the resonant portion is configured to have a planar shape that is an ellipse having a part thereof cut off along a straight line that intersects a minor axis and a major axis of the ellipse.

9. A film bulk acoustic resonator comprising:
a resonant portion having a piezoelectric material layer sandwiched between a first electrode and a second electrode,
wherein the resonant portion is configured to have a planar shape that is an ellipse having a part thereof cut off along a straight line that intersects one of the minor axis and the major axis of the ellipse, and the planar shape that is the ellipse having the part thereof cut off along the straight line does not contain the center of the ellipse.

10. A film bulk acoustic resonator comprising:
a resonant portion having a piezoelectric material layer sandwiched between a first electrode and a second electrode,
wherein the resonant portion is configured to have a planar shape that is an ellipse having a part thereof cut off,
wherein in at least one of the first electrode and the second electrode within the planar shape forming the resonant portion, a hole part extending to the piezoelectric material layer is provided, and the hole part is provided on, from among normal lines to be provided for the straight line along which the ellipse is cut, a normal line passing through a tangent point on a tangent line of the ellipse, the tangent line being parallel to the straight line.

* * * * *